United States Patent
Sannomiya et al.

(10) Patent No.: US 7,683,320 B2
(45) Date of Patent: Mar. 23, 2010

(54) TRANSMISSION ELECTRON MICROSCOPE

(75) Inventors: Takumi Sannomiya, Kochi-Ken (JP); Yukihito Kondo, Tokyo (JP)

(73) Assignee: Jeol Ltd., Tokyo (JP)

( * ) Notice: Subject to any disclaimer, the term of this patent is extended or adjusted under 35 U.S.C. 154(b) by 304 days.

(21) Appl. No.: 11/741,370

(22) Filed: Apr. 27, 2007

(65) Prior Publication Data

US 2008/0011949 A1  Jan. 17, 2008

(30) Foreign Application Priority Data

Apr. 28, 2006 (JP) .............................. 2006-125974

(51) Int. Cl.
*H01J 37/26* (2006.01)
*G21K 7/00* (2006.01)
(52) U.S. Cl. ................. 250/311; 250/358.1; 250/359.1; 250/397; 250/398
(58) Field of Classification Search ............. 250/311, 250/305, 398
See application file for complete search history.

(56) References Cited

U.S. PATENT DOCUMENTS

| | | | | |
|---|---|---|---|---|
| 5,221,844 A | * | 6/1993 | van der Mast et al. | 250/398 |
| 5,233,192 A | | 8/1993 | De Jong et al. | |
| 5,300,775 A | * | 4/1994 | Van der Mast | 250/305 |
| 5,373,158 A | * | 12/1994 | Murakoshi et al. | 250/311 |
| 6,570,156 B1 | * | 5/2003 | Tsuneta et al. | 250/311 |
| 6,888,139 B2 | * | 5/2005 | Tsuneta et al. | 250/311 |
| 2007/0158568 A1 | * | 7/2007 | Nakamura et al. | 250/311 |

FOREIGN PATENT DOCUMENTS

JP    7-220669    8/1995

OTHER PUBLICATIONS

F. Hosokawa et al., "On-Line Alignment and Astigmatism Correction Using a TV and Personal Computer," *Proc. 51st Annual Meeting of the Microscopy Society of America*, Published by San Francisco Press, Inc., San Francisco, CA, USA (1993), pp. 202-203.
Fumio Hosokawa, "Automatic Tuning of TEM Using Diffractograms," *Journal of the Japanese Society of of Microscopy*, vol. 36, No. 2 (2001), pp. 115-117.

* cited by examiner

*Primary Examiner*—Nikita Wells
*Assistant Examiner*—Johnnie L Smith
(74) *Attorney, Agent, or Firm*—The Webb Law Firm

(57) ABSTRACT

In a transmission electron microscope, an electron beam flux of a cross section constricted conically over a reference specimen is made to hit the reference specimen. The flux includes electron beams hitting the specimen at incident angles which spread conically in the direction of irradiation. The beams are focused onto a fluorescent screen at positions which are different in distance from the center according to the incident angles. A transmission image of the beam flux is gained. A Fourier transform is performed for each of inspection regions set on the transmission image. Aberration coefficients $C_1$, $C_2$, ..., $C_i$ are calculated from the obtained, Fourier-transformed images by image processing. Aberration in the imaging lenses is corrected. Consequently, the aberration can be corrected by finding the aberration coefficients $C_1, C_2, \ldots, C_i$ from only one transmission image. The number of transmission images or the acquisition time is reduced.

7 Claims, 4 Drawing Sheets

TRANSMISSION ELECTRON MICROSCOPE

BACKGROUND OF THE INVENTION

1. Field of the Invention

The present invention relates to a transmission electron microscope for correcting aberrations in electron beams transmitted through a specimen.

2. Description of Related Art

In recent years, transmission electron microscopes have tended to have higher resolutions. The resolution of a transmission electron microscope is chiefly limited by aberration in the electrical lens system that focuses the electron beam onto a fluorescent screen or the like. Accordingly, in a known procedure, the resolution is improved by measuring aberration in the lens system and correcting the aberration in the lens system based on the data obtained by the measurement (see, for example, Japanese Patent Laid-Open No. H7-220669 (page 1, FIG. 1)).

In the measurement of the aberration, the electron beam is made to hit an amorphous reference specimen at various angles of irradiation. A transmission image formed on the fluorescent screen at each angle of irradiation is recorded as digital information about a transmission image. Since the information about the transmission image contains information about the aberration in the lens, quantitative information about the aberration is gained by image analysis, and aberration coefficients for electrically correcting the lens system are found from the information about the aberration. Fumio Hosokawa, "Automatic Tuning of TEM Using Diffractograms", *Journal of the Japanese Society of Microscopy*, 2001, Vol. 36, No. 2, p. 115.

However, with the background art described above, much labor and time are required to gain information about transmission images. That is, in order to derive quantitative information about aberration by image analysis, it is necessary that information about many transmission images be gained by varying the angle of irradiation at which an electron beam is repeatedly made to hit a reference specimen.

Especially, when accurate aberration information or information about higher-order aberrations is derived, it is necessary that the angle of irradiation of the electron beam be varied more finely and that information about more transmission images be image-processed. In this case, still more labor and time are required to gain information about transmission images.

Consequently, it is important to realize a transmission electron microscope which can complete acquisition of transmission image information providing a basis of aberration information in a short time and which quickly corrects aberration.

SUMMARY OF THE INVENTION

It is an object of the present invention to provide a transmission electron microscope which can complete acquisition of transmission image information providing a basis of aberration information in a short time and which quickly corrects aberration.

This object is achieved by a transmission electron microscope according to a first embodiment of the present invention, the microscope having: (a) beam generation device for producing electron beams and directing them at a reference specimen; (b) beam flux creation device for creating an electron beam flux from the electron beams such that incident angles of the beams to the reference specimen spread conically about a direction in which the beams are directed; (c) image detection device for detecting the electron beam flux transmitted through the reference specimen and for gaining information about a transmission image; (d) lens or lenses for focusing the electron beams when they are detected as described previously; and (e) aberration correction system for setting plural inspection regions on the transmission image indicated by the information about the transmission image and for correcting aberration in the lens or lenses based on information about Fourier-transformed images of the inspection regions which are irradiated with the beams at different values of the incident angle.

In this first embodiment, the beam flux creation device creates an electron beam flux including electron beams incident on a reference specimen at incident angles spreading conically about the direction of irradiation. The aberration correction system sets the plural inspection regions on the transmission image indicated by the information about the transmission image. The inspection regions are irradiated with the beams at different incident angles. Aberration in the lens or lenses is corrected based on the information about the Fourier-transformed images of the individual inspection regions.

A transmission electron microscope according to a second embodiment of the present invention is based on the first embodiment and further characterized in that the reference specimen is made of an amorphous material.

In the second embodiment, the reference specimen creates an elliptical or hyperbolic Fourier-transformed image.

A transmission electron microscope according to a third embodiment of the present invention is based on the first or second embodiment and further characterized in that the aberration correction system finds the amount of defocus and the amount of astigmatism for each of the inspection regions based on the information about the Fourier-transformed image and calculates aberration coefficients used for the correction using plural values of the amount of defocus and plural values of the amount of astigmatism.

A transmission electron microscope according to a fourth embodiment of the present invention is based on the third embodiment and further characterized in that the aberration correction system uses nonlinear least squares fitting when the aberration coefficients are found from plural values of the amount of defocus and plural values of the amount of astigmatism.

In this fourth embodiment, the amount of defocus and the amount of astigmatism are optimized.

A transmission electron microscope according to a fifth embodiment of the present invention is based on the third embodiment and further characterized in that the aberration correction system has inspection regions which are equidistant from the center position of the transmission image and show regularly spaced azimuthal angles to the center position.

In the fifth embodiment, each inspection region is specified only with parameters for the azimuthal angle.

A transmission electron microscope according to a sixth embodiment of the present invention is based on the fifth embodiment and further characterized in that cross-sectional profiles of the Fourier-transformed image using the azimuthal angles as parameters are employed when the aberration correction system finds the aberration coefficients from plural values of the amount of defocus and plural values of the amount of astigmatism.

In the sixth embodiment, aberration coefficients including higher-order aberrations are calculated in a short time.

A transmission electron microscope according to a seventh embodiment of the present invention is based on any one of the first through sixth embodiments and further characterized in that the image detection device has a two-dimensional array of solid-state imaging elements in a plane perpendicular to the direction of irradiation.

In the seventh embodiment, the image detection device easily derives accurate digital images.

According to the present invention, an electron beam flux spreading conically about the direction of irradiation is created by the beam flux creation device. The aberration correction system sets plural inspection regions on a transmission image of the reference specimen, the inspection regions being irradiated with the beams at different angles of incidence. Aberration in the lens or lenses is corrected based on information about Fourier-transformed images of the individual inspection regions. Therefore, aberration can be corrected from information only about one transmission image. In consequence, the number of transmission images or acquisition time required in various cases including the case where an accurate correction or a correction of higher-order aberrations is made can be reduced.

Other objects and features of the invention will appear in the course of the description thereof, which follows.

DESCRIPTION OF THE PREFERRED EMBODIMENTS

The best mode for implementing a transmission electron microscope according to the present invention is hereinafter described with reference to the accompanying drawings. It is to be noted that the invention is not limited thereto.

Figure 1:
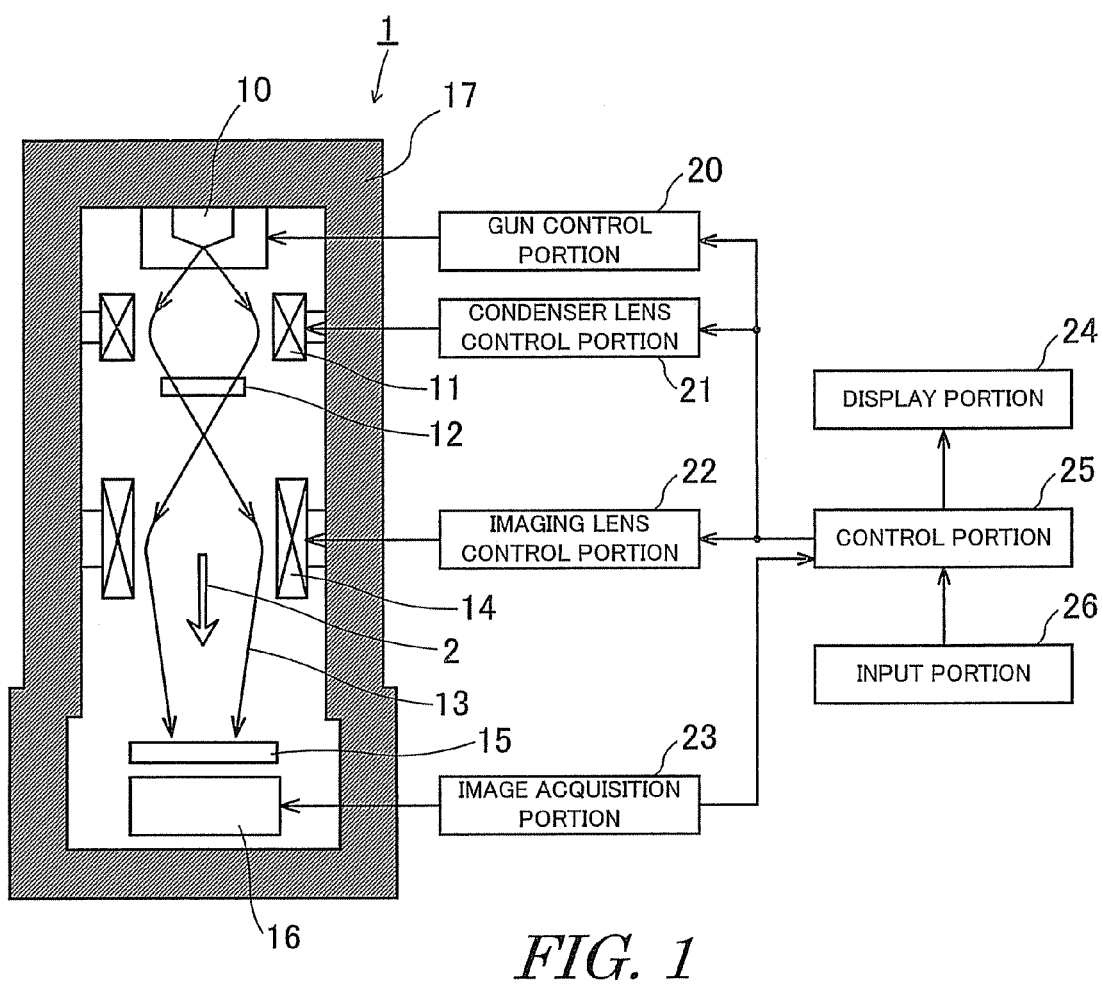
FIG. 1 is a cross-sectional view of the whole structure of a transmission electron microscope.

The whole structure of a transmission electron microscope 1 according to the present embodiment is first described. FIG. 1 shows one example of the transmission electron microscope 1. The microscope 1 has a housing 17 whose interior is evacuated to a vacuum. Mounted inside the housing 17 are an electron gun 10, condenser lenses 11, a reference specimen 12, imaging lenses 14, a fluorescent screen 15, and an image recording device 16.

The microscope 1 includes a control system having a control portion 25, a gun control portion 20, a condenser lens control portion 21, and an imaging lens control portion 22. In addition, the control system includes an image acquisition portion 23, a display portion 24, and an input portion 26 which are connected with the control portion 25.

The electron gun 10 is disposed at the top of the housing 17 and emits an electron beam flux 13 nearly in a direction of irradiation 2 that is the downwardly vertical direction. The electron gun 10 forms an electron beam generation device. The accelerating voltage and the amount of beam current are adjusted by the gun control portion 20. The condenser lenses 11 are disposed under the gun 10. The condenser lenses 11 form an electron beam flux creation device. The value of electrical current that forms a magnetic field is controlled by the condenser lens control portion 21. This adjusts the size of the beam flux 13, i.e., the degree of focusing.

The reference specimen 12 is disposed over the beams of the beam flux 13 by a setting means (not shown), the beam flux 13 hitting lower parts of the condenser lenses 11. The reference specimen 12 is a planar specimen consisting of a directionless amorphous material that can be regarded as a weak phase object.

The imaging lenses 14 forms a lens means and acts to focus the electron beam flux 13 transmitted through the reference specimen 12 onto the fluorescent screen 15. The imaging lenses 14 has coils opposite to each other in a direction perpendicular to the direction of irradiation 2 that is the direction of travel of the electron beam flux 13. The beam flux 13 is focused by the lens effect of the magnetic field produced by the coils. The values of the electrical currents supplied into the coils are controlled by the values of the electrical currents from the imaging lens control portion 22.

The imaging lenses 14 that is a lens means incorporates quadrupole or octopole coils and makes astigmatic correction. In these coils, the current ratio of the 2 or 4 sets of opposite coils is adjusted based on aberration coefficients, thus correcting astigmatism.

The fluorescent screen 15 emits fluorescent light when irradiated with the electron beam flux 13, and creates a transmission image of the reference specimen 12. Thus, the operator can observe the transmission image of the reference specimen 12 through an observation window (not shown).

The image recording device 16 converts the transmission image created on the fluorescent screen 15 into digital information about the transmission image of the reference specimen 12. The image recording device 16 incorporates CCD or CMOS solid-state imaging elements and digitizes the transmission image. After the information about the transmission image is transferred to the image acquisition portion 23, the information is displayed as a visible image on the display portion 24. The fluorescent screen 15, image recording device 16, and image acquisition portion 23 together constitute an image detection device. The image recording device 16 can be taken into and out of the housing 17 through an access port (not shown) of the housing 17.

The control portion 25 includes a CPU and a memory, and controls the gun control portion 20, condenser lens control portion 21, imaging lens control portion 22, and image acquisition portion 23 to generate the electron beam flux 13, condense it, focus the flux onto the fluorescent screen 15, and acquire information about the transmission image. The control portion 25 has an aberration correction system and controls the imaging lens control portion 22 based on transmission image information derived via the image acquisition portion 23.

The control portion 25 has the display portion 24 consisting of an LCD or the like and the input portion 26 including a keyboard. The control portion 25 enters and displays various parameters. In addition, the control portion displays information about a transmission image, the information being derived by the image acquisition portion 23.

Figure 2:
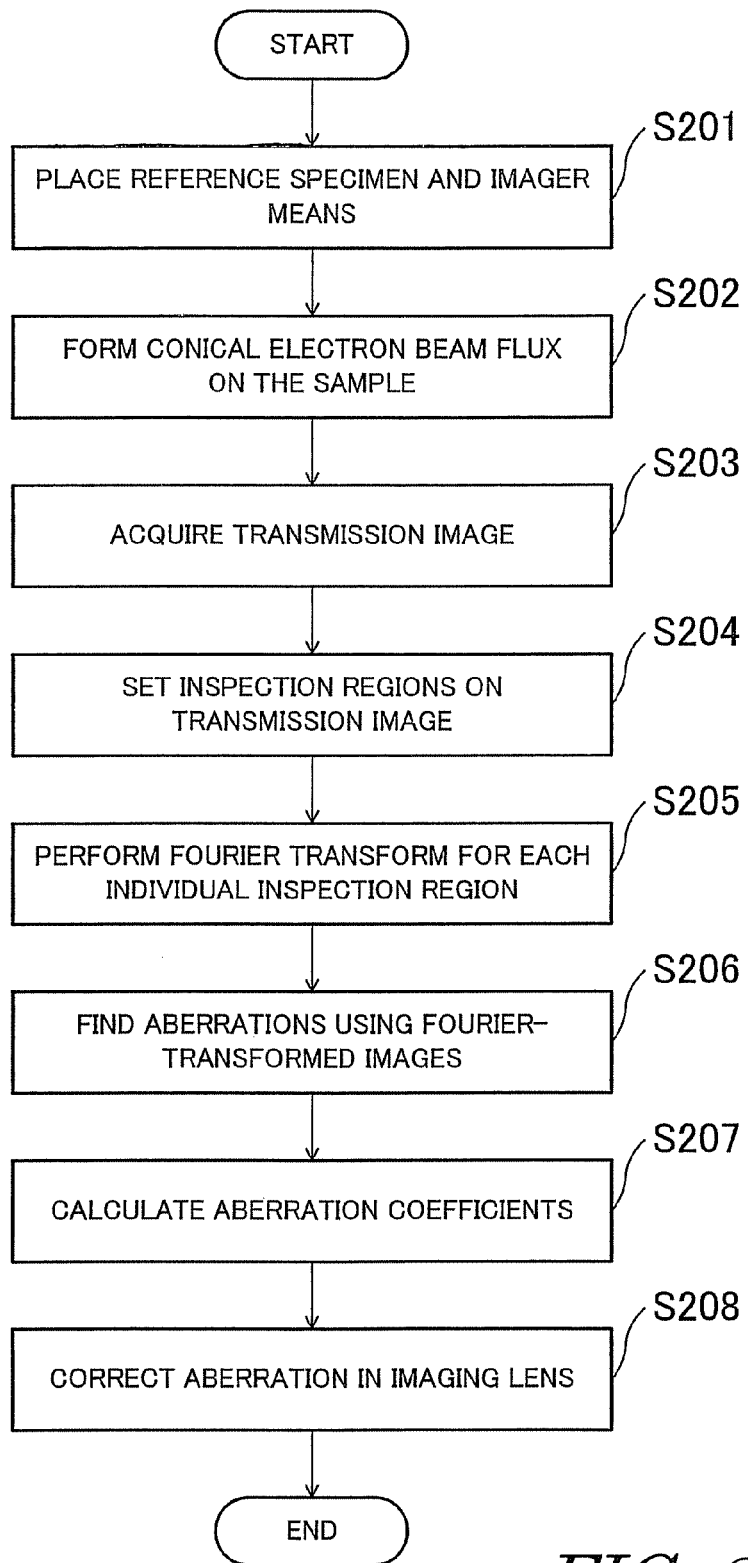
FIG. 2 is a flowchart illustrating the operation of a transmission electron microscope according to an embodiment of the present invention.

The operation of the transmission electron microscope 1 is next described by referring to the flowchart of FIG. 2. First, the operator places the reference specimen 12 in the path of the electron beam flux 13 located under the condenser lenses 11 and places the image recording device 16, such as a CCD camera, under the fluorescent screen 15 (step S201).

Then, the operator adjusts the condenser lenses 11 with the condenser lens control portion 21 to constrict the electron beam flux 13 toward the reference specimen 12 such that the flux contains electron beams spreading conically and hitting the reference specimen 12 at angles of incidence spreading conically in the direction of irradiation 2 (step S202).

Figure 3:
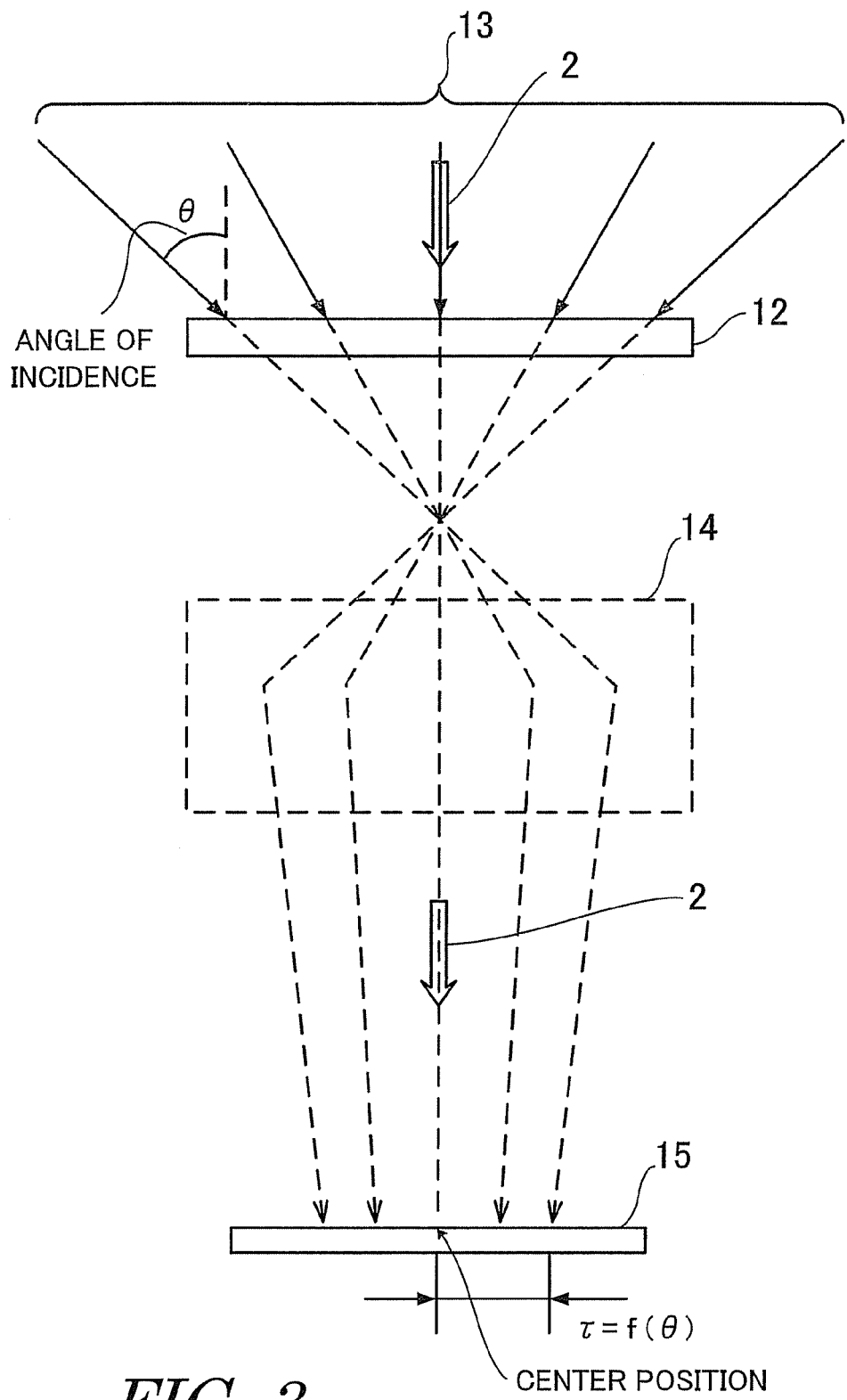
FIG. 3 is a ray diagram illustrating the geometry of an electron beam flux according to an embodiment of the invention and a focal point.

FIG. 3 is a ray diagram schematically illustrating one example of the electron beam flux 13 which is constricted conically and directed at the reference specimen 12. In the beam flux 13, the electron beams that are located around the center of the beam flux 13 and in the downwardly vertical direction of irradiation 2 are incident on the reference specimen 12 at angles of incidence which are symmetrically distributed within an angular range centered at 0°. The positive and negative maximum angular values of the beams do not exceed 90°.

The electron beam flux 13 is condensed to a required extent by the imaging lenses 14 and focused onto the fluorescent screen 15. The focal position of the imaging lenses 14 is so adjusted that the distance $\tau$ from the center position in the image on the fluorescent screen 15 is determined by the incident angles $\theta$ of each electron beam forming the beam flux 13. Therefore, the distance $\tau$ is given by $\tau=f(\theta)$, i.e., the distance $\tau$ is a function of the angle of incidence $\theta$. On the fluorescent screen 15, the angles of incidence are almost equal in the vicinity of the positions in the image.

Referring back to FIG. 2, the control portion 25 acquires information about a transmission image of the reference specimen 12, using the electron beam flux 13 (step S203). The control portion 25 then displays the information about the transmission image on the display portion 24.

Subsequently, the operator sets plural inspection regions 41-47, for which Fourier transforms will be performed, on the transmission image 40 displayed on the display portion 24 (step S204). A Fourier transform is performed for each individual inspection region to find Fourier-transformed images 51-57 (step S205). Inspection regions previously registered in the control portion 25 may be automatically set as the inspection regions 41-47.

Figure 4:
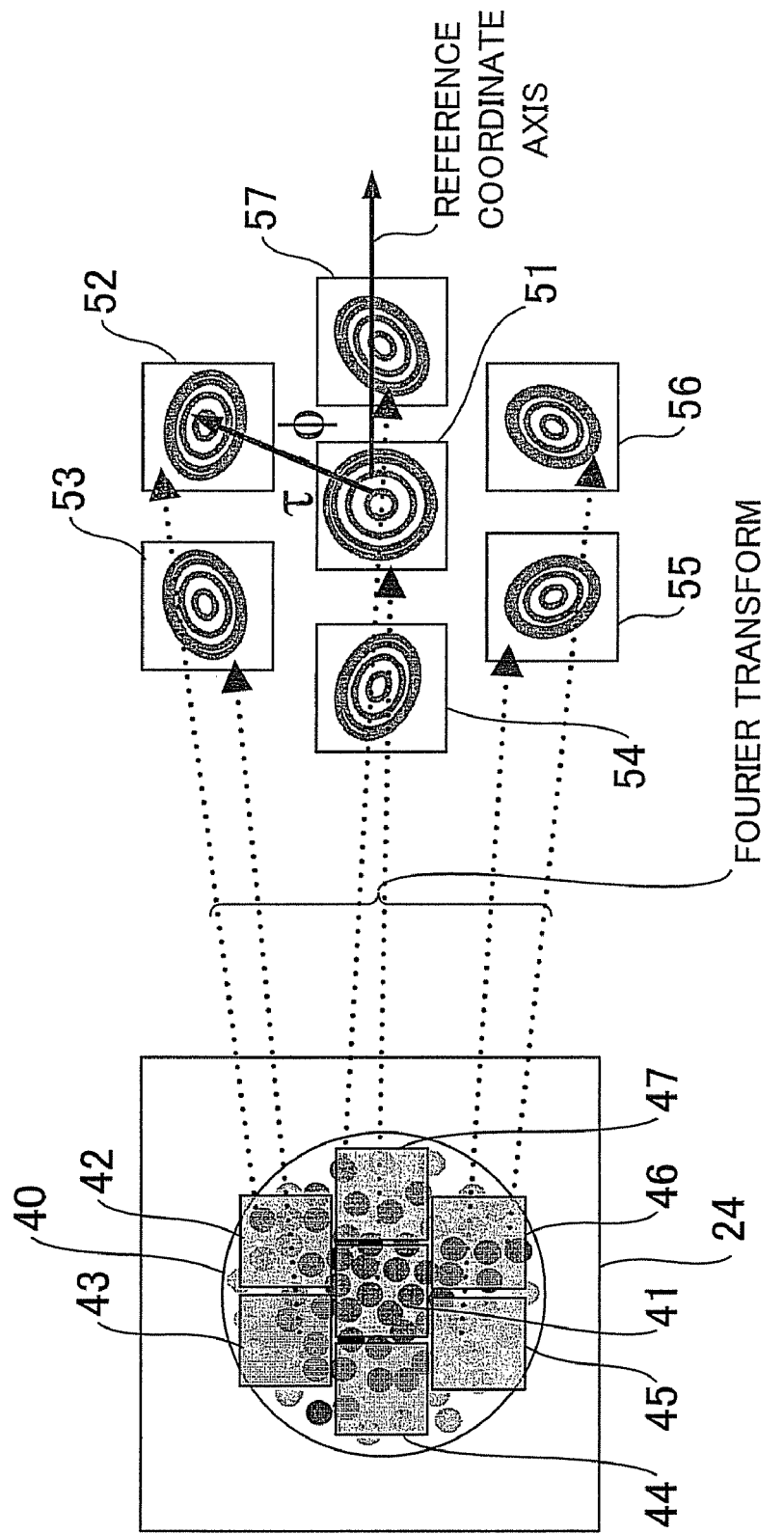
FIG. 4 illustrates inspection regions set on a transmission image and Fourier-transformed images.

FIG. 4 shows the transmission image 40 displayed on the display portion 24, the plural inspection regions 41-47 set on the transmission image 40, and the Fourier-transformed images 51-57 obtained by Fourier-transforming the inspection regions 41-47.

In FIG. 4, the transmission image 40 is shown as a gathering of spotty images in the example. The inspection region 41 is set on the center of the transmission image 40. The six inspection regions 42-47 are set around the inspection region 41. The inspection regions 41-47 are square regions having the same size and arranged to almost fully cover the whole transmission region 40.

As described previously, the angle at which each electron beam is incident on the reference specimen 12 and the direction of the beam are different among the inspection regions 41-47. The inspection regions 41-47 are parameterized by polar coordinates $(\tau_m, \phi_m)$ in a polar coordinate system whose pole (central point) lies in the center of the transmission image 40. The polar coordinate system has a reference coordinate axis extending to one side. $\tau_m$ is the distance from the pole to the center position of each inspection region. $\phi_m$ is the deflection angle that is an azimuthal angle formed between the reference coordinate axis and a line segment that connects the pole with the center position of a corresponding one of the inspection regions. The subscript m is a numeral from 1 to 7, and is an index indicating each of the inspection regions 41-47.

The polar coordinates $(\tau_m, \phi_m)$ of the inspection regions 41-47 reflect the incident angle and direction of each electron beam focused on these inspection regions when the beam hits the reference specimen 12 as described previously. The polar coordinates are used as parameters indicating the incident angle and direction of the electron beam incident on the reference specimen 12.

The Fourier-transformed images 51-57 are obtained by Fourier-transforming the inspection regions 41-47 of the transmission image 40. The Fourier-transformed images 51-57 are represented using the values of the index m of the inspection regions 41-47. Where the reference specimen 12 is amorphous, each Fourier-transformed image consists of an annular pattern including plural concentric circles as shown in FIG. 4. These annular patterns are elliptical in a case where defocus and astigmatism are present in the imaging lenses 14.

Returning to FIG. 2, the aberration correction device of the control portion 25 finds aberrations using the Fourier-transformed images 51-57 with m=1 to 7 (step S206). The control portion 25 finds the amount of defocus $Df_m$, the amount of astigmatism $A_m$, and the direction $\theta_m$ in which astigmatism is present for each of the Fourier-transformed images 51-57 with m=1 to 7 from the direction of the major or minor axis of the annular elliptical pattern and from the length of the major or minor axis (see, for example, Japanese Patent Laid-Open No. H7-220669).

Then, the aberration correction device of the control portion 25 calculates aberration coefficients $C_1, C_2, \ldots, C_i$ based on the found values, i.e., the amount of defocus $Df_m$, the amount of astigmatism $A_m$, and the direction $\theta_m$ in which astigmatism is present (step S207). The amount of defocus $Df_m$, amount of astigmatism $A_m$, and direction $\theta_m$ are given by $$Df_m = Df(C_1, C_2, \ldots, C_i, \tau_m, \phi_m)$$

$$A_m = A(C_1, C_2, \ldots, C_i, \tau_m, \phi_m)$$

$$\theta_m = \theta(C_1, C_2, \ldots, C_i, \tau_m, \phi_m)$$

Thus, they are represented as functions of the aberration coefficients $C_1, C_2, \ldots, C_i, \tau_m, \phi_m$. The control portion 25 calculates the aberration coefficients $C_1, C_2, \ldots, C_i$, using the amounts of defocus $Df_m$, amounts of astigmatism $A_m$, and directions $\theta_m$ in which astigmatism is present at the found seven polar coordinates $(\tau_m, \phi_m)$ and using the functions Df, A, and $\theta$. In these calculations, the number of conditional formulas is set to greater than the number of unknowns. The aberration correction device of the control portion 25 calculates optimum aberration coefficients $C_1, C_2, \ldots, C_i$, using nonlinear least squares fitting (see, for example, Fumio Hosokawa, "Automatic Tuning of TEM Using Diffractograms", *Journal of the Japanese Society of Microscopy*, 2001, Vol. 36, No. 2, p. 115).

Then, the control portion 25 corrects the aberration in the imaging lenses 14 using the aberration coefficients $C_1, C_2, \ldots, C_i$ (step S208). The present processing is ended. For example, where astigmatism is corrected, the octopole coil present in the imaging lenses 14 is used. The octopole coil consists of four opposite sets of coils. The magnitudes of electrical currents supplied to the opposite coils are determined from the aberration coefficients $C_1, C_2, \ldots, C_i$, using a given function.

As described previously, in the present embodiment, the electron beam flux 13 constricted conically over the reference specimen 12 is made to hit the specimen 12. The flux 13 contains electron beams having incident angles spreading conically in the direction of irradiation 2. Each beam is focused on the fluorescent screen 15 at a position at a distance from the center, the distance being different according to the incident angle. The transmission image 40 represented by the beam flux 13 is acquired. The plural inspection regions 41-47 are set on the transmission image 40. A Fourier transform is performed for each of the inspection regions 41-47 on the transmission image 40. The amount of defocus $Df_m$, amount of astigmatism $A_m$, and direction $\theta_m$ in which astigmatism is present are found from the obtained Fourier-transformed images 51-57. Furthermore, the aberration coefficients $C_1, C_2, \ldots, C_i$ are found based on these amounts. Aberration in the imaging lenses 14 is corrected. Therefore, the aberration coefficients $C_1, C_2, \ldots, C_i$ are found from only one transmission image 40 and the aberration can be corrected. Consequently, in a case where accurate correction or correction of higher-order aberrations is made, the number of transmission images or the acquisition time can be reduced. The aberration correction can be completed in a shorter time.

In the present embodiment, the number of the inspection regions 41-47 set on the transmission image 40 is seven. The incident angle of the electron beam to the reference specimen 12 can be classified more finely by increasing the number of the set inspection regions. This increases the range of the numbers specified by the index m. The aberration coefficients $C_1, C_2, \ldots, C_i$ calculated using the functions Df, A, and $\theta$ can be made more accurate.

In the present embodiment, a case in which the first-order aberration is corrected has been described. In cases where higher-order aberrations such as aberrations of the second and higher orders are corrected, higher-order aberrations can be corrected from the single transmission image 40 similarly by increasing the number of the inspection regions 41-47 set on the transmission image 40.

Furthermore, in the present embodiment, the aberration coefficients $C_1, C_2, \ldots, C_i$ are calculated from the amount of defocus $Df_m$, amount of astigmatism $A_m$, and direction $\theta_m$ in which astigmatism is present at each of polar coordinates ($\tau_m$, $\phi_m$) and from the functions Df, A, and $\theta$, using nonlinear least squares fitting. Alternatively, the distance $\tau_m$ (from the center) of each polar coordinate ($\tau_m$, $\phi_m$) indicating the positions of the inspection regions may be kept constant. The deflection angle $\phi_m$ that is an azimuthal angle may be taken at any one of angular positions regularly angularly spaced from each other. The functions Df, A, and $\theta$ are subjected to a one-dimensional Fourier transform in which the deflection angle $\phi_m$ is used as a parameter. The aberration coefficients $C_1, C_2, \ldots, C_i$ can be calculated from the found Fourier coefficients.

Having thus described our invention with the detail and particularity required by the Patent Laws, what is desired protected by Letters Patent is set forth in the following claims.

The invention claimed is:

1. A transmission electron microscope comprising:
    (a) beam generation means for producing electron beams and directing them at a reference specimen;
    (b) beam flux creation means for creating an electron beam flux from the electron beams such that incident angles of the electron beams to the reference specimen spread conically about a direction in which the beams are directed;
    (c) image detection means for detecting the electron beam flux transmitted through the reference specimen and for gaining information about a transmission image;
    (d) lens means for focusing the electron beams when they are detected as described previously; and
    (e) aberration correction means for setting plural inspection regions on the transmission image indicated by the information only about one transmission image and for correcting aberration in the lens means based on information about Fourier-transformed images of the inspection regions which are irradiated with the beams at different values of the incident angle.

2. A transmission electron microscope as set forth in claim 1, wherein said reference specimen is made of an amorphous material.

3. A transmission electron microscope as set forth in any one of claims 1 and 2, wherein said aberration correction means finds an amount of defocus and an amount of astigmatism for each of said inspection regions based on said information about the Fourier-transformed images and calculates aberration coefficients used for the correction using plural values of the amount of defocus and plural values of the amount of astigmatism.

4. A transmission electron microscope as set forth in claim 3, wherein said aberration correction means uses nonlinear least squares fitting when the aberration coefficients are found from the plural values of the amount of defocus and plural values of the amount of astigmatism.

5. A transmission electron microscope as set forth in claim 3, wherein said aberration correction means has inspection regions which are equidistant from a center position of said transmission image and show regularly spaced azimuthal angles to said center position.

6. A transmission electron microscope as set forth in claim 5, wherein said aberration correction means uses cross-sectional profiles of said Fourier-transformed image in which said azimuthal angles are used as parameters when said aberration coefficients are found from the plural values of the amount of defocus and plural values of the amount of astigmatism.

7. A transmission electron microscope as set forth in any one of claims 1 and 2, wherein said image detection means is equipped with a two-dimensional array of solid-state imaging elements on a plane perpendicular to said direction of irradiation.

\* \* \* \* \*